(12) United States Patent
Hall (10) Patent No.: US 8,304,331 B2
(45) Date of Patent: Nov. 6, 2012

(54) ANGLED ION IMPLANTATION IN A SEMICONDUCTOR DEVICE

(75) Inventor: Mark D. Hall, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 141 days.

(21) Appl. No.: 12/787,101

(22) Filed: May 25, 2010

(65) Prior Publication Data

US 2011/0291180 A1    Dec. 1, 2011

(51) Int. Cl.
*H01L 21/425* (2006.01)
(52) U.S. Cl. .................. 438/525; 257/E21.41
(58) Field of Classification Search .............. 257/E21.41; 438/299–300, 302, 429, 505–506, 508, 524–526, 438/531, 607
See application file for complete search history.

(56) References Cited

U.S. PATENT DOCUMENTS

| | | | |
|---|---|---|---|
| 5,340,754 A * | 8/1994 | Witek et al. ................... | 438/156 |
| 5,414,289 A * | 5/1995 | Fitch et al. ................... | 257/329 |
| 6,326,272 B1 * | 12/2001 | Chan et al. ................... | 438/300 |
| 6,576,945 B2 | 6/2003 | Mandelman et al. | |
| 7,057,224 B2 | 6/2006 | Lindstedt et al. | |
| 7,369,436 B2 | 5/2008 | Forbes | |
| 7,378,702 B2 | 5/2008 | Lee | |
| 7,399,673 B2 | 7/2008 | Tempel | |
| 7,504,298 B2 | 3/2009 | Manning et al. | |
| 7,511,332 B2 | 3/2009 | Yang | |
| 7,514,324 B2 | 4/2009 | Leslie | |
| 7,615,428 B2 | 11/2009 | Zheng et al. | |
| 8,034,692 B2 * | 10/2011 | Nayfeh et al. ................. | 438/302 |
| 2006/0114478 A1 * | 6/2006 | Borden et al. ................. | 356/636 |
| 2009/0081860 A1 * | 3/2009 | Zhou et al. .................... | 438/531 |

* cited by examiner

Primary Examiner — Jenny L Wagner
Assistant Examiner — Mark Tornow
(74) Attorney, Agent, or Firm — David G. Dolezal; Daniel D. Hill (57) ABSTRACT

Angled ion implants are utilized to form doped regions in a semiconductor pillar formed in an opening of a mask. The pillar is formed to a height less than the height of the mask. Angled ion implantation can be used to form regions of a semiconductor device such as a body tie region, a halo region, or current terminal extension region of a semiconductor device implemented with the semiconductor pillar.

20 Claims, 13 Drawing Sheets

ANGLED ION IMPLANTATION IN A SEMICONDUCTOR DEVICE

BACKGROUND OF THE INVENTION

1. Field of the Invention

This invention relates in general to semiconductor devices and specifically to angled ion implantation in semiconductor devices.

2. Description of the Related Art

Ion implantation is utilized in the production of semiconductor devices. For example, ion implantation can be used to dope regions of a semiconductor device with impurities to alter the electrical properties of the region. Ions can be implanted with an ion implanter, such as the Axcelis NV8250, at a 0 degree angle (0 degrees with a line that is orthogonal to a major surface of the wafer) or at non zero degree angles (angled implant).

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As described herein, semiconductor device regions may be formed by angled ion implantation using a mask that is used in the formation of a body and/or other active structures of the device. In various embodiments, angled ion implantation is used to form an extension region, a halo implant region, or a body tie region for the device.

Figure 1:
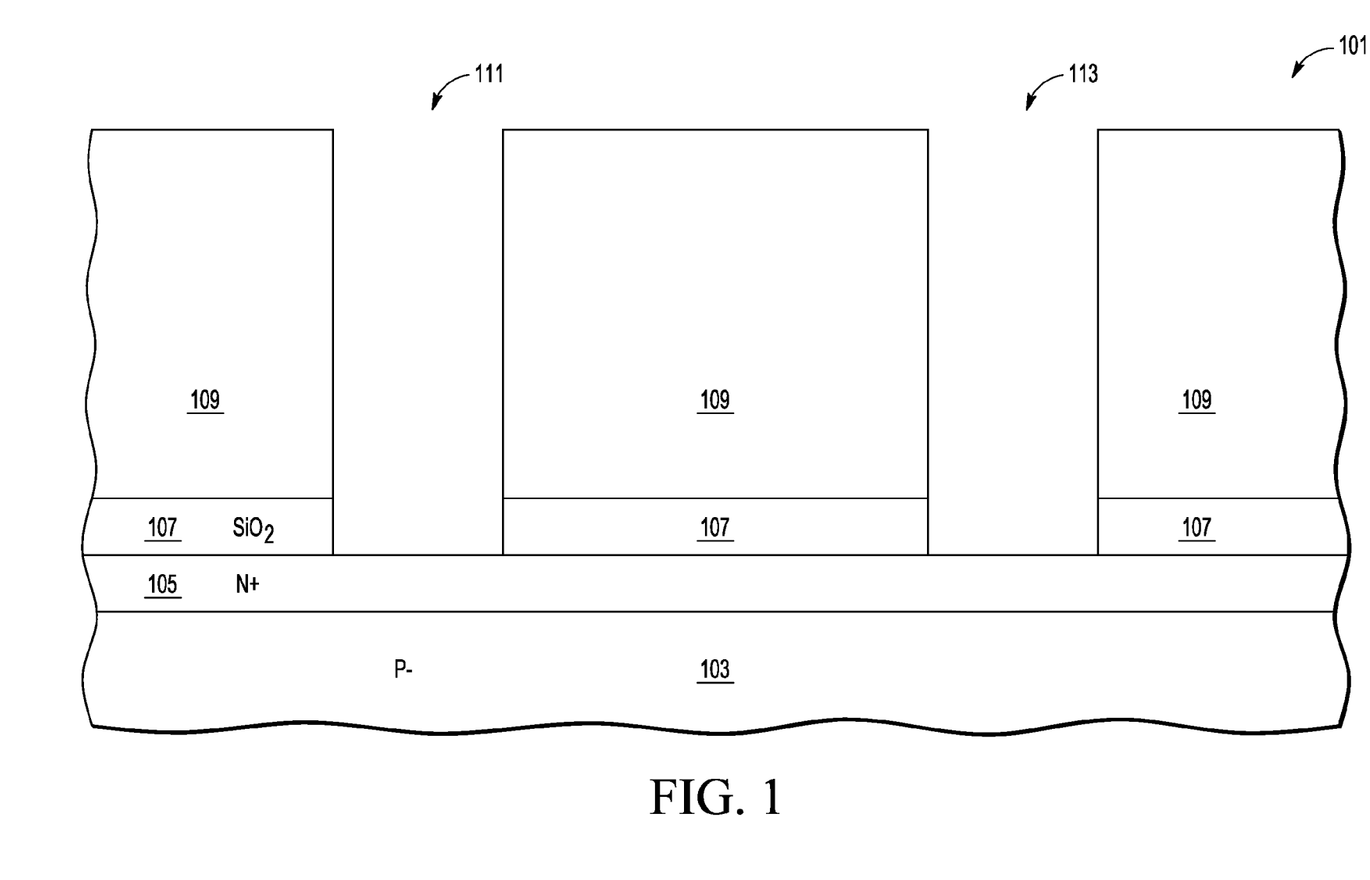
FIGS. 1-13 set forth various views of forming a semiconductor device according to one embodiment of the present invention.

FIG. 1 is a side view of a partial cross section of a wafer according to one embodiment of the present invention. Wafer 101 includes a substrate layer 103 of a doped semiconductor material. In one embodiment layer 103 is implemented as a bulk monocrystalline silicon substrate having a P type doping (e.g. boron, $BF_2$). However, layer 103 may have other doping profiles in other embodiments. In addition, substrate layer 103 may be made of other types of semiconductor materials (e.g. silicon germanium, type III-V materials). Also, wafer 101 could have other configurations such as e.g. a semiconductor on insulator (SOI) configuration.

A layer 105 of heavily doped semiconductor material is located on layer 103. In the embodiment shown, layer 105 is doped with N type dopants (e.g. phosphorus, antimony, arsenic). In one embodiment, layer 105 is formed by implanting substrate layer 103 with N-type dopants. In other embodiments, layer 105 is either grown or deposited on layer 103. In one embodiment, layer 105 is doped with phosphorus ions at a concentration of $10^{17}$ atoms per $cm^3$ or greater, but may be doped with other dopants or have other doping concentrations in other embodiments.

A layer 107 of silicon dioxide is located over layer 105. In one embodiment layer, 107 is deposited on layer 105, but in other embodiments, it may be formed by the oxidation of layer 105. In one embodiment, layer 107 is 300 Angstroms thick, but may be of other thicknesses in other embodiments.

A layer 109 of nitride (e.g. silicon nitride) is formed over layer 107. In one embodiment, layer 109 is 2000 Angstroms thick, but may be of other thicknesses in other embodiments. In one embodiment, layer 109 is deposited by a low pressure chemical vapor deposition process (LPCVD) at a high temperature (e.g. above 600 C) to provide for precise thickness control. However, layer 109 may be deposited by other processes (e.g. a plasma enhanced chemical vapor process). Layer 109 will subsequently be used as a mask for angled ion implantation.

After the formation of layer 109, openings 111 and 113 are formed in wafer 101 to expose layer 105. In one embodiment, openings 111 and 113 are circular openings having a diameter in the range of 600 to 1500 Angstroms, but may have other diameters in other embodiments. In one embodiment, the lower range of the diameter size is dependent upon the minimum size of a contact base for the processes used in forming a semiconductor device. In other embodiments, the holes may have other forms (e.g. oval, rectangle, square, or other shape). In one embodiment, openings 111 and 113 are formed by patterning a layer of photo resist with corresponding openings and exposing the wafer to etchants reactive with respect to the material to be removed (e.g. silicon nitride of layer 109 and silicon oxide of layer 107). Openings 111 and 113 may be formed by other methods in other embodiments.

Figure 2:
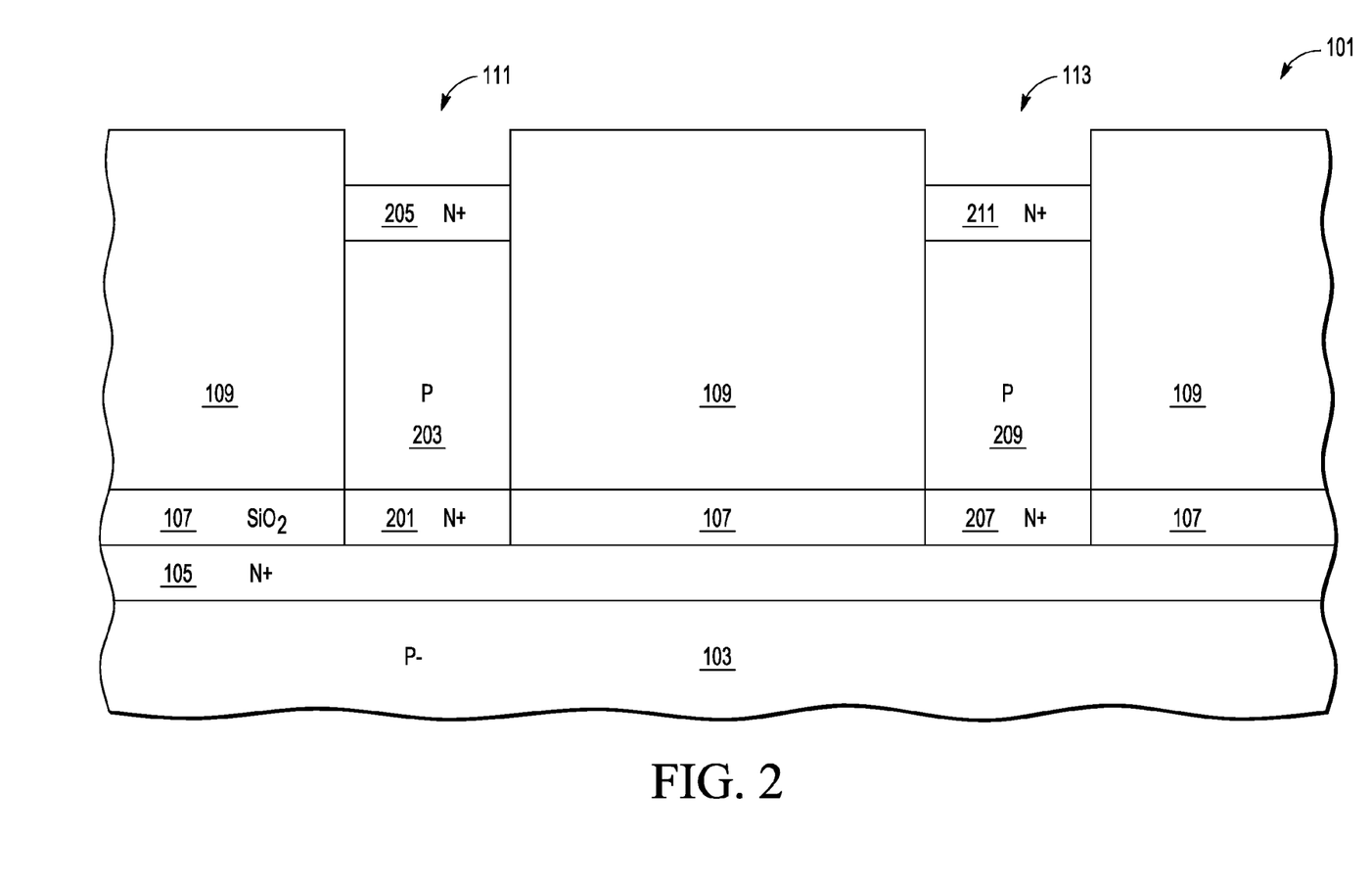

FIG. 2 is a side view of a partial cross section of a wafer 101 at another stage in its manufacture. After the formation of the openings in wafer 101, silicon (or other semiconductor material) is epitaxially grown in the openings. Afterwards, the silicon is doped to form different regions (205, 203, 201, 211, 209, and 207) of a semiconductor device. In FIG. 2, mono crystalline silicon is grown in openings 111 and 113 to a height that is less than the top surface of nitride layer 109. In one embodiment, the silicon is grown in an epitaxial reactor at a high temperature (e.g. 800 C and higher) for more precise height control of the silicon. However, the silicon may be formed in the openings by other methods in other embodiments. In one embodiment, the top of the silicon in the openings (the top of regions 205 and 211) is at a vertical distance from top of layer 109 by 500 Angstroms, but it may be at other distances in other embodiments.

The epitaxial silicon in the openings is doped to have three different regions. The bottom regions 201 and 207 of the epitaxial silicon are heavily doped with an N type dopant. In one example, the ion concentration of N type dopants is $10^{17}$ atoms per $cm^3$ or higher, but may be of other concentrations in other embodiments. Regions 201 and 207 will serve as source regions for subsequently formed vertical FETs. In one embodiment, regions 201 and 207 have a thickness of 300 angstroms, but may have other thicknesses in other embodiments.

Regions 203 and 209 are lightly doped with a P type dopant. In one embodiment, regions 203 and 209 have a doping concentration of P type dopants of $10^{15}$ to $10^{17}$ atoms per $cm^3$, but may be of other doping concentrations in other embodiments. In one embodiment, regions 203 and 209 have a thickness in the range of 900 to 1200 Angstroms, but may be of other thicknesses in other embodiments. Regions 203 and 209 will serve as body regions in subsequently formed vertical FETs.

The top regions 205 and 211 of the epitaxial silicon are heavily doped with N type dopants. In one example, the ion concentration of the N type dopants is $10^{17}$ atoms per $cm^3$ or higher, but may be of other concentrations in other embodiments. Regions 205 and 211 will serve as drain regions for subsequently formed vertical FETs. In one embodiment, regions 205 and 211 have a thickness of 300 angstroms, but may have other thicknesses in other embodiments.

In one embodiment, regions 201, 203, 205, 207, 209, and 211 are doped by ion implantation with an ion beam being at an angle that is 0 degrees from a line that is orthogonal with a major surface of wafer 101 (a line that is straight up and down in the embodiment of FIG. 2). The ions are implanted at energies that depend on the depth that the ions are to be implanted in order to form the regions with the stated thicknesses. However, the regions may be doped in other ways in other embodiments. For example, the regions may be in-situ doped with the appropriate ion impurities during the epitaxial formation.

Figure 3:
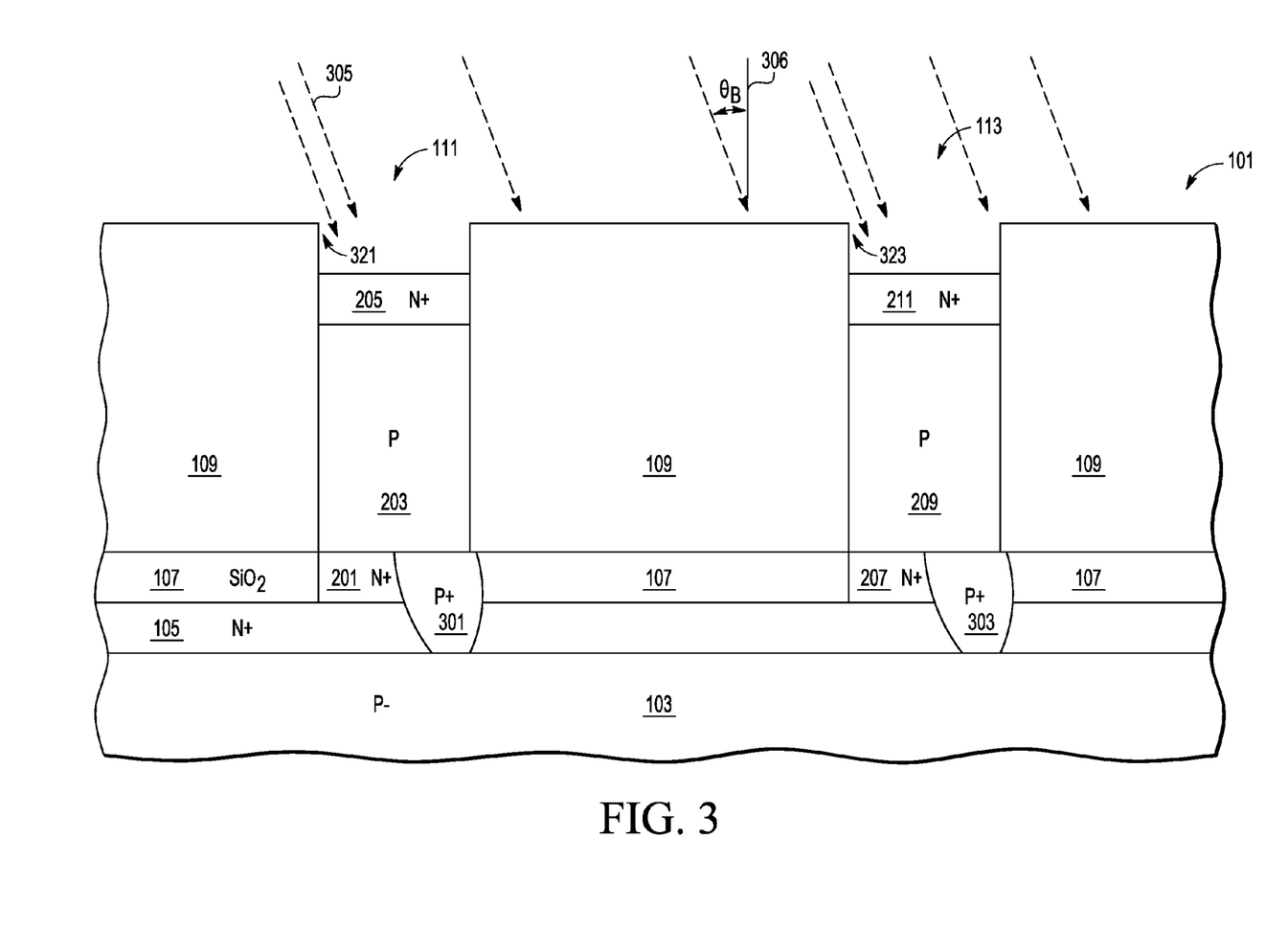

FIG. 3 is a side view of a partial cross section of a wafer 101 at another stage in its manufacture. In the embodiment shown, body tie regions 301 and 303 are formed by ion implantation of P type dopants to form body tie regions from regions 203 and 209 through regions 201 and 207, respectively, through N+ layer 105 to P type substrate layer 103. Body tie regions 301 and 303 serve to provide an electrical connection from the body region of a transistor (regions 203 and 209) to the substrate layer 103. When utilized in a charge storage memory cell, body tie regions allow an escape path for holes during hot carrier injection of electrons into the charge storage layer (see structures 815 and 817 of FIG. 8).

In the embodiment shown, regions 301 and 303 are formed by using an angled ion implantation process. An angled ion implantation process is an ion implantation process where the ion beam (e.g. 305) is at a non zero angle (as represented by theta b in FIG. 3) with respect to a line (line 306) that is orthogonal with a major surface of the wafer. In one embodiment, the ions that form region 301 and 303 are implanted at an angle that is in the range of 10-20 degrees, but may be formed by ion implantation at other angles in other embodiments. In one embodiment, the concentration of the P type ions in region 301 and 303 is in the range of $10^{17}$ atoms per $cm^3$ or higher, but may be of other concentrations in other embodiments. The ion beams 305 have a sufficient energy to implant the ions at the desired depth to form the body tie regions.

Figure 4:
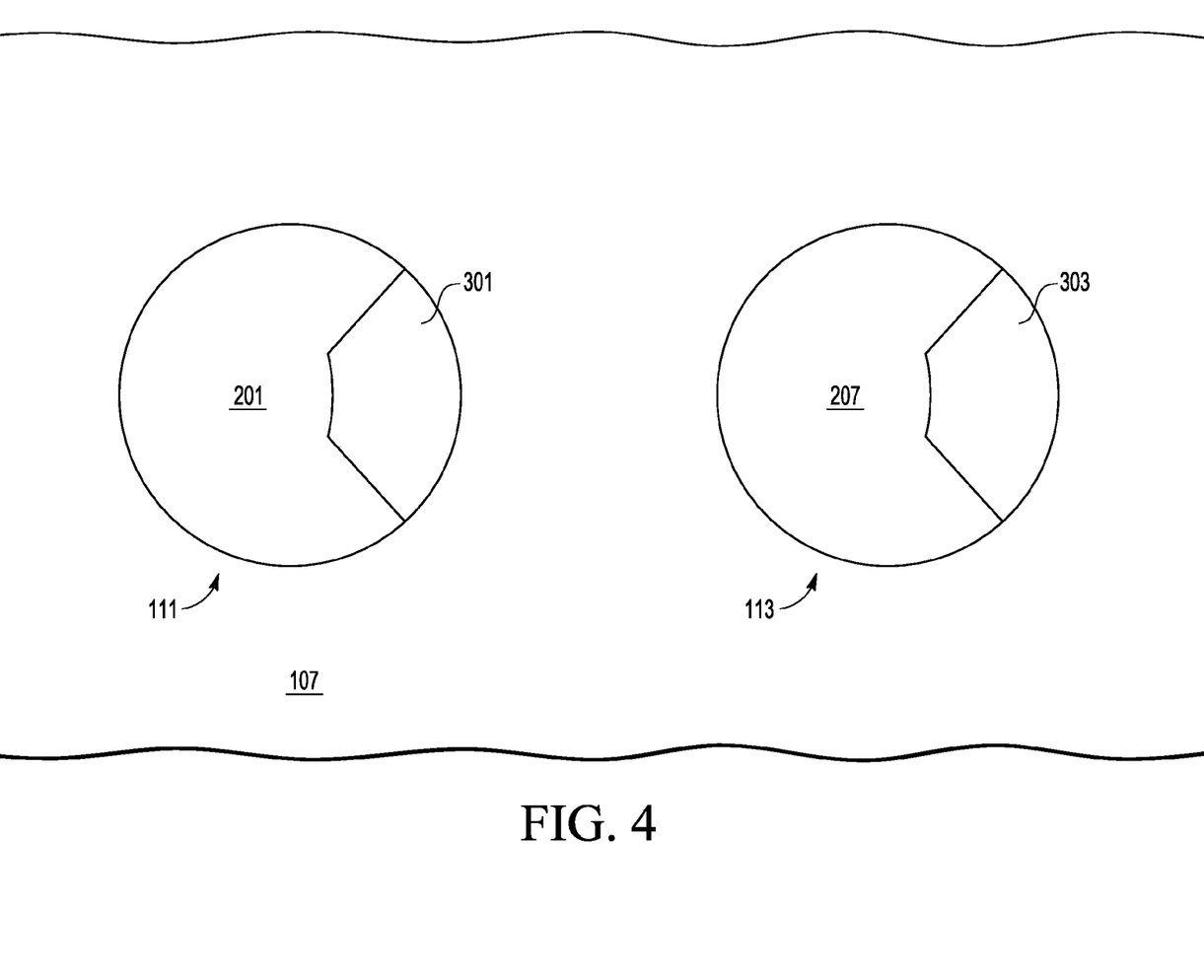

FIG. 4 is a top view of a partial horizontal cross section of wafer 101. The horizontal cross section shown in FIG. 4 is at a height at the top of layer 107 in the cross section of FIG. 3. In the embodiment shown, the body tie regions 301 and 303 occupy only part of the cross sectional diameter of openings 111 and 113 respectively, at that cross section. The remaining portions of the cross sectional diameter are of N+ regions 201 and 207 which will serve as source regions for subsequently formed vertical transistors.

In one embodiment, the ions for the body tie regions 301 and 303 are implanted while the wafer 101 is rotated in a range less than 360 degrees on an axis that is orthogonal with respect to a major surface of the wafer. Because the wafer 101 was not rotated at a full 360 degrees during ion implantation, body tie regions 301 and 303 are not adjacent to all of the inner surfaces of openings 111 and 113. If wafer 101 was rotated at 360 degrees during body tie ion implantation, then the body tie region would have a doughnut shape (a full annular shape) for the view of FIG. 4. See for example regions 501 and 503 in FIG. 6 for a doughnut shaped annular region where angled ion implantation is performed by rotating the wafer 360 degrees. In one embodiment, the wafer is rotated at an angle that is 270 degrees or less. Accordingly, regions 301 and 303 have a partial annular region due to the less than full 360 degree rotation.

In the embodiment shown in FIGS. 3 and 4, implanting the ion dopants at an angle allows the formation of the body tie regions to be partially coextensive with the source regions at a horizontal cross section of the epitaxial region. For example in FIG. 4, regions 201 and 301 in opening 111 each occupy a portion of opening 111 at the cross section. Such a co-extensiveness could not be achieved by a non angled (0 degree) implant without the formation of extra masking structures to partially cover the opening. However, using an angled implant allows the sides 321 and 323 of the openings of layer 109 to serve as a mask for the implantation so that only a portion of the cross section of an opening is implanted at a depth. Those ions that fall on layer 109 are for the most part blocked from the epitaxial silicon by the nitride material. Providing coextensive regions of an opening cross section allows for two different conductive paths to be formed in a vertical transistor.

Furthermore, performing ion implantation where the wafer is rotated at less than 360 degrees allows the edge of the silicon pillar at a horizontal cross section to include both a body tie region and a source region. Because the channel region predominately occurs at the perimeter of the pillar, it is desirable for at least some of the perimeter of the silicon pillar to be the source region and not the body tie region.

In another embodiment, the body tie region can be formed by implanting region 201 and the region of layer 105 below the openings 111 and 113 with a P type heavy doping at a zero angle sufficient for a body tie region. Afterwards, a heavy N-type dopant sufficient for a source region can be implanted at an angle to form N+ source full annular regions around the P+ body ties in the locations of regions 201 and 207. With such an embodiment, the body tie region would occupy the center portion of the epitaxial cylinder cross sections (of the view of FIG. 4) and the source region would surround the center body tie region. With such an embodiment, the source region would be located around the entire perimeter of the pillar.

Figure 5:
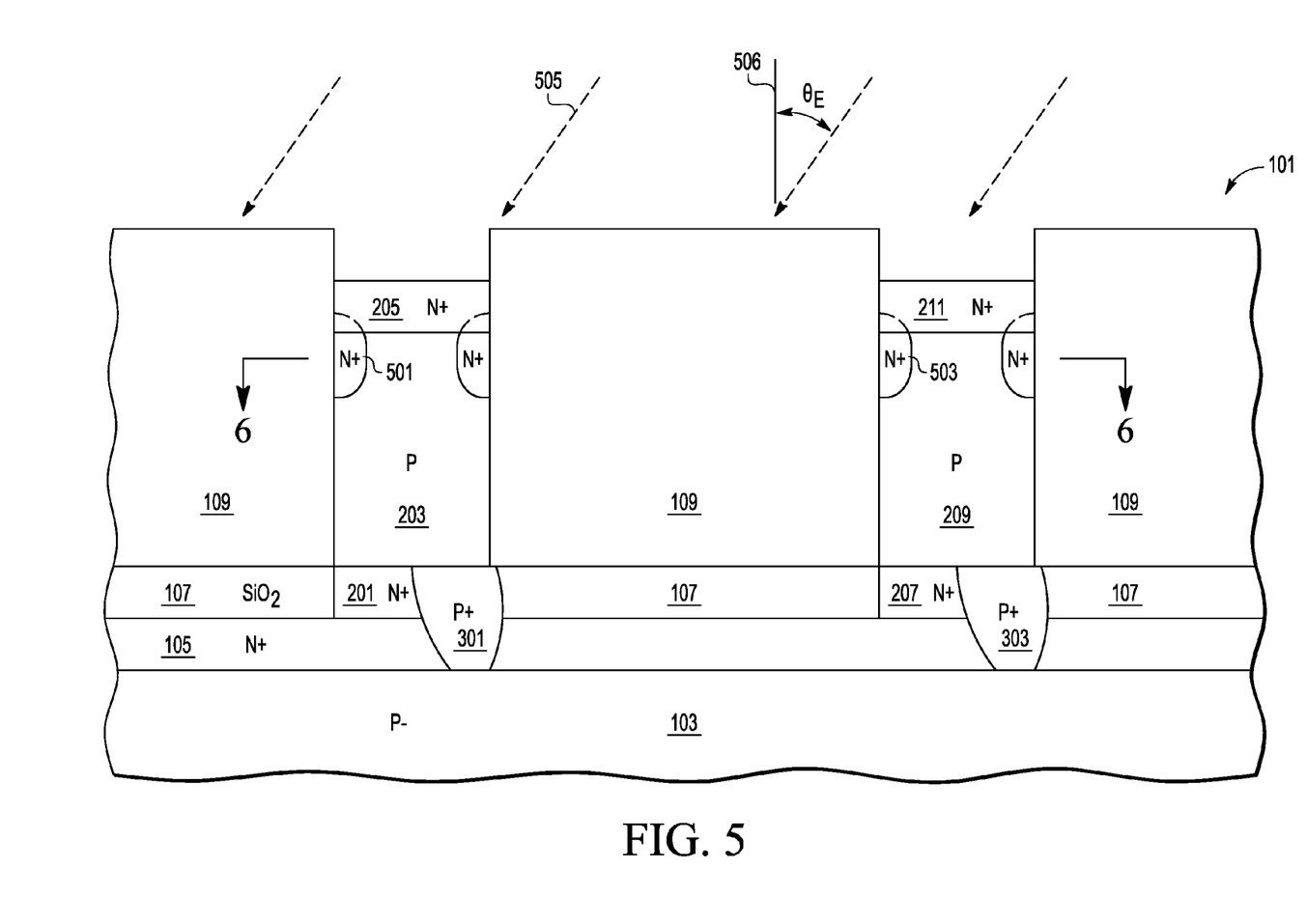

FIG. 5 is a side view of a partial cross section of a wafer 101 at another stage in its manufacture. In the embodiment shown, drain extension regions 501 and 503 are formed by angled ion implantation of N type dopants. In one embodiment, the ion concentration of the N type dopants is $10^{16}$ to $10^{18}$ atoms per $cm^3$, but may be of other concentrations in other embodiments. In one embodiment, ions are implanted at an angle (theta E) of 30-60 degrees from a line orthogonal to a major surface of wafer 101 (line 506). However, the ions may be implanted at other angles in other embodiments. In the embodiment of FIG. 5, the top portions of the extension implants that are in drain regions 205 and 211 are shown as dashed lines in that the extension ion concentration is less than the ion concentration for drain regions 205 and 211. The ions are implanted at an energy needed to place the peak of the implant at the desired location. During the angled implantation, layer 109 acts to inhibit ion implantation at certain portions of the pillar to form the annular shape. Accordingly, at a particular cross section, the portion of the middle of the pillar is not implanted due to the inhibition of the ions by layer 109.

Figure 6:
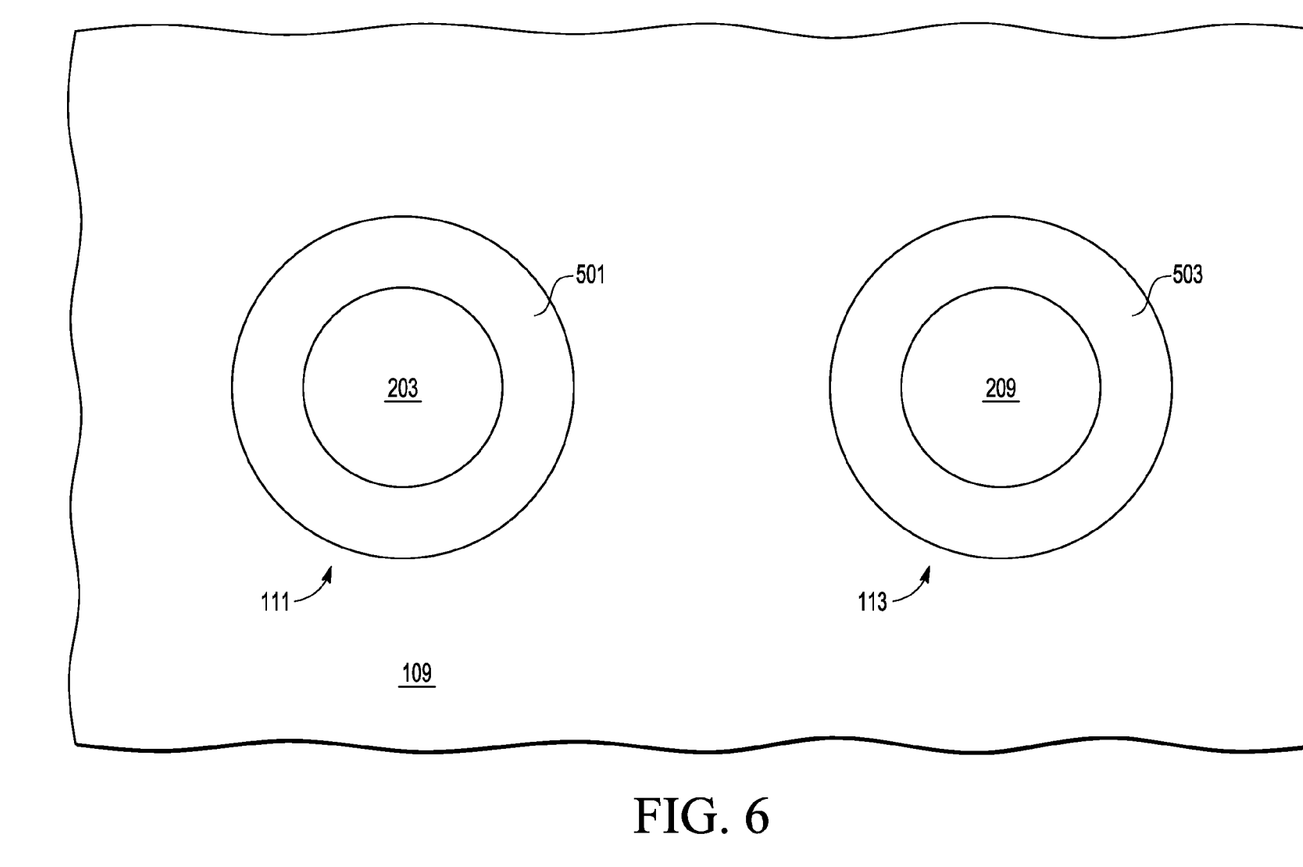

FIG. 6 is a top view of a partial cross section of wafer 101. As shown in FIG. 6, extension regions 501 and 503 have a full annular shape that surrounds a portion of the body regions 203 and 209. The width of the annular shape is dependent upon the angle of ion implantation and the implant energy. Generally, at a given angle, the higher the energy, the smaller the width of the doughnut. During the angled ion implantation, wafer 101 is rotated 360 degrees (or is spun around) as evidenced by the fact that the extension regions are located on the entire perimeter of the silicon pillars in openings 111 and 113.

Utilizing an angled ion implantation for a drain extension region of a vertical transistor allows for the lightly doped region to be located on the perimeter around the body region where the channel region of a vertical transistor will be formed.

Figure 7:
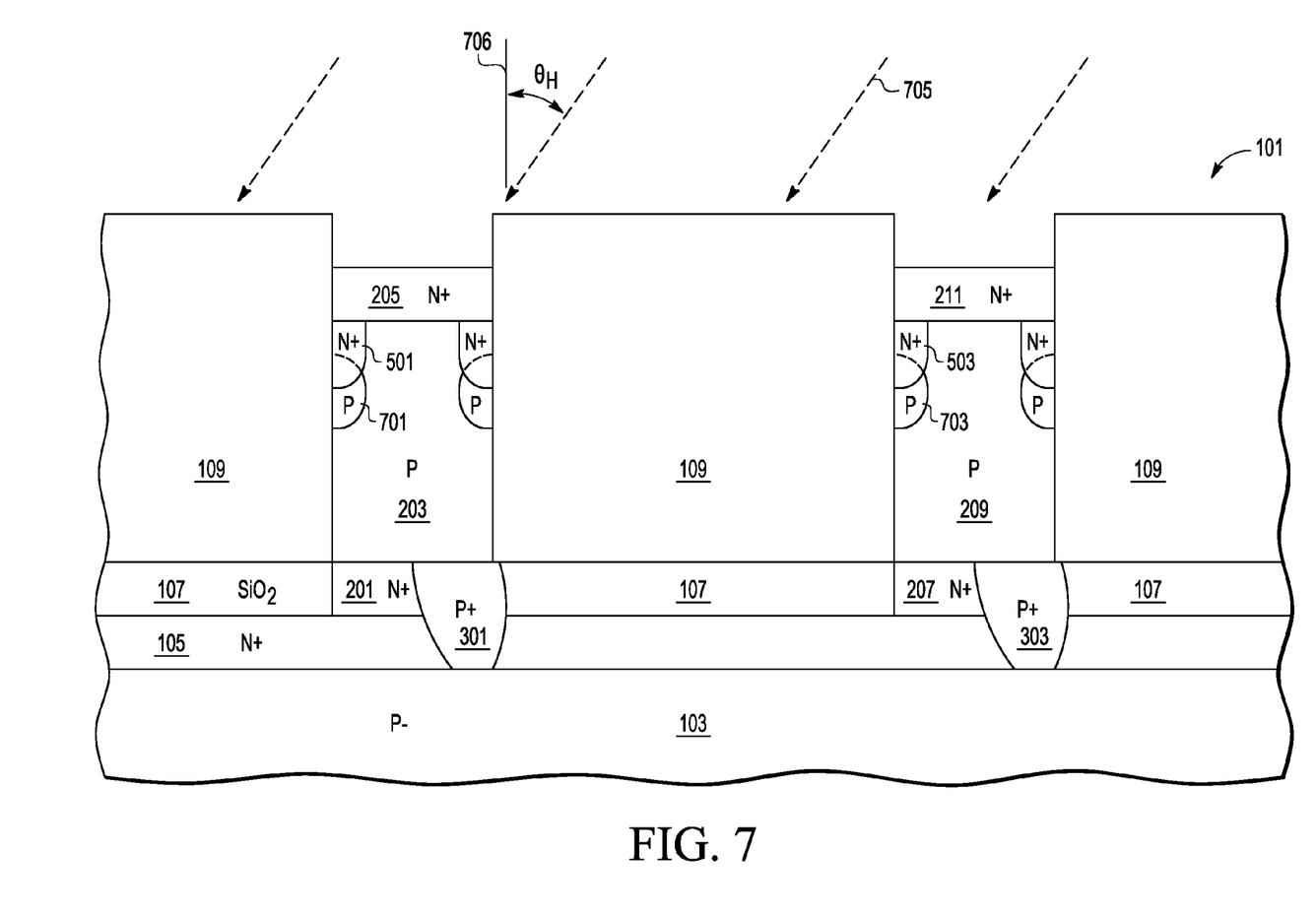

FIG. 7 is a side view of a partial cross section of wafer 101 at another stage in its manufacture. In the embodiment shown, halo regions 701 and 703 are formed by angled ion implantation of P type dopants. Halo regions are utilized to prevent the depletion regions from extending from the drain region to the source region during a conductive state of a transistor. In one embodiment, the ion concentration of the P type dopants is $10^{16}$ to $10^{18}$ atoms per $cm^3$, but may be at other concentrations in other embodiments. In one embodiment, ions are implanted at an angle (theta H) of 20-40 degrees from a line orthogonal to a major surface of wafer 101 (line 706). However, the ions may be implanted at other angles in other embodiments. In the embodiment of FIG. 7, the top portions of the halo implant that are in extension regions 501 and 503 are shown by the dashed lines. The halo ions are implanted at an energy needed to place the peak of the implant at the desired location.

In one embodiment, the halo ions are implanted while the wafer is rotated 360 degrees (e.g. spun during implantation). Accordingly, halo regions 501 and 503 will have a full annular shape (similar to that of regions 501 and 503 in FIG. 6).

Using an angled implant to make a halo implant for a vertical transistor allows for the halo region ions to be located at the perimeter of the body region, which is where the channel region will be formed and where source-drain punch through is likely to occur.

Figure 8:
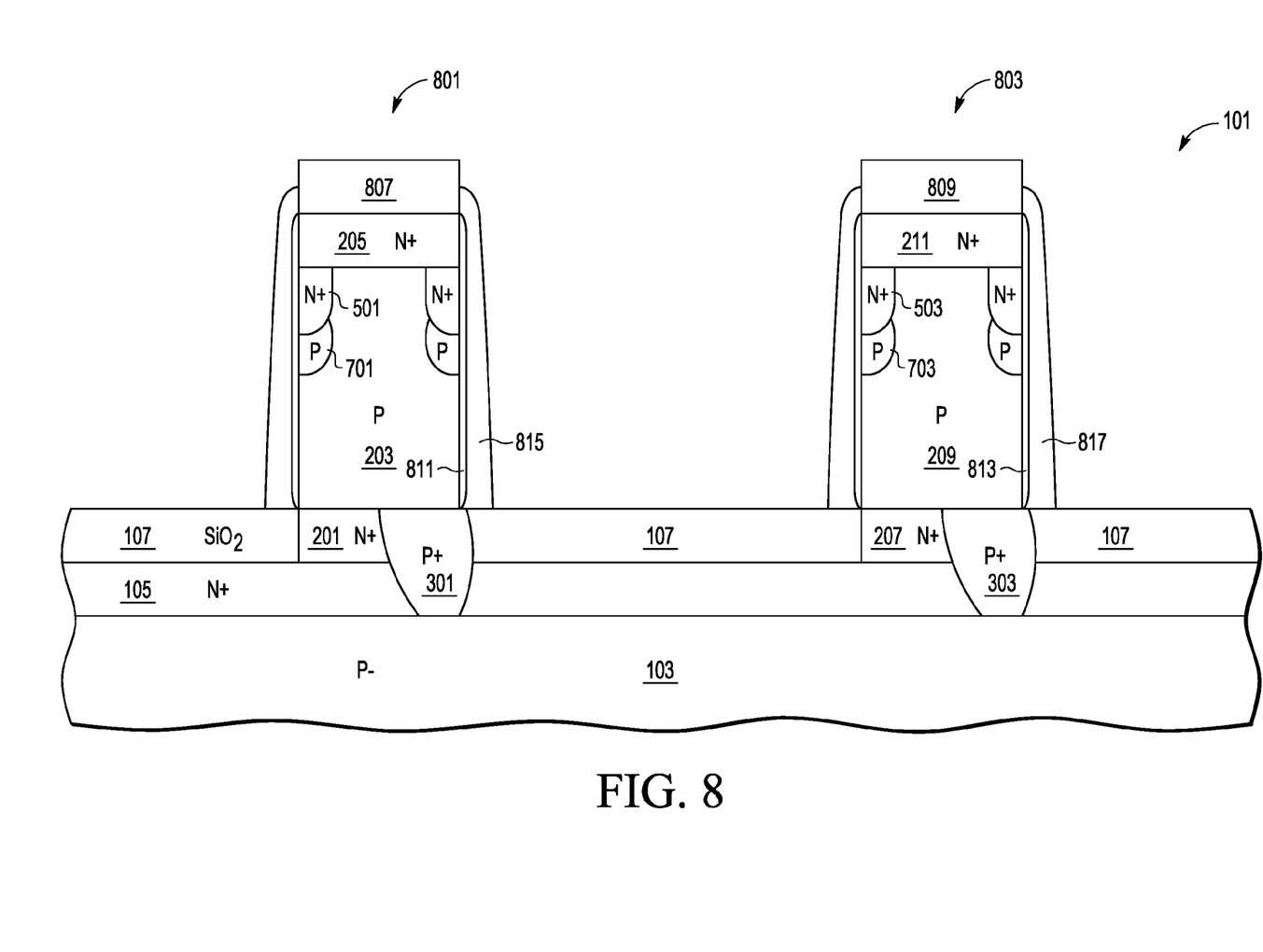

FIG. 8 is a side view of a partial cross section of wafer 101 after oxide caps 807 and 809 are formed over pillar structures 801 and 803 and nitride layer 109 is subsequently removed. Caps 807 and 809 are formed by depositing a layer of silicon oxide over wafer 101 and planarizing the wafer (e.g. with a CMP process) using layer 109 as a planarization stop. Afterwards nitride layer 109 is removed with an etchant (e.g. $CF_4/CH_4$, $NF_3/CH_4$) that is selective to silicon oxide and reactive with respect to silicon nitride.

After layer 109 has been removed, tunnel oxide layers 811 and 813 are grown on the silicon portions of pillar structures 801 and 803 by an oxidation process. In other embodiments, layers 811 and 813 may be formed by a blanket deposition of a dielectric material (e.g. silicon oxide or a high K dielectric material). Layers 811 and 813 are formed to surround pillar structures 801 and 803, respectively.

After the formation of the tunnel oxide, charge storage structures 815 and 817 are formed. In one embodiment, charge storage structures 815 and 817 are formed from a charge storage material and are for storing charge in a non volatile memory device. Examples of charge storage materials include polysilicon, nitride, or a layer with charge storing nanoclusters (e.g. silicon nanocrystals).

In one embodiment, structures 815 and 817 are formed by depositing a layer of charge storage material over wafer 101 and then anisotropically etching the layer to form the structures. In one embodiment, the layer of charge storage material has a thickness of 40-500 Angstroms (depending upon the type of charge storage material), but may have other thicknesses in other embodiments.

Figure 9:
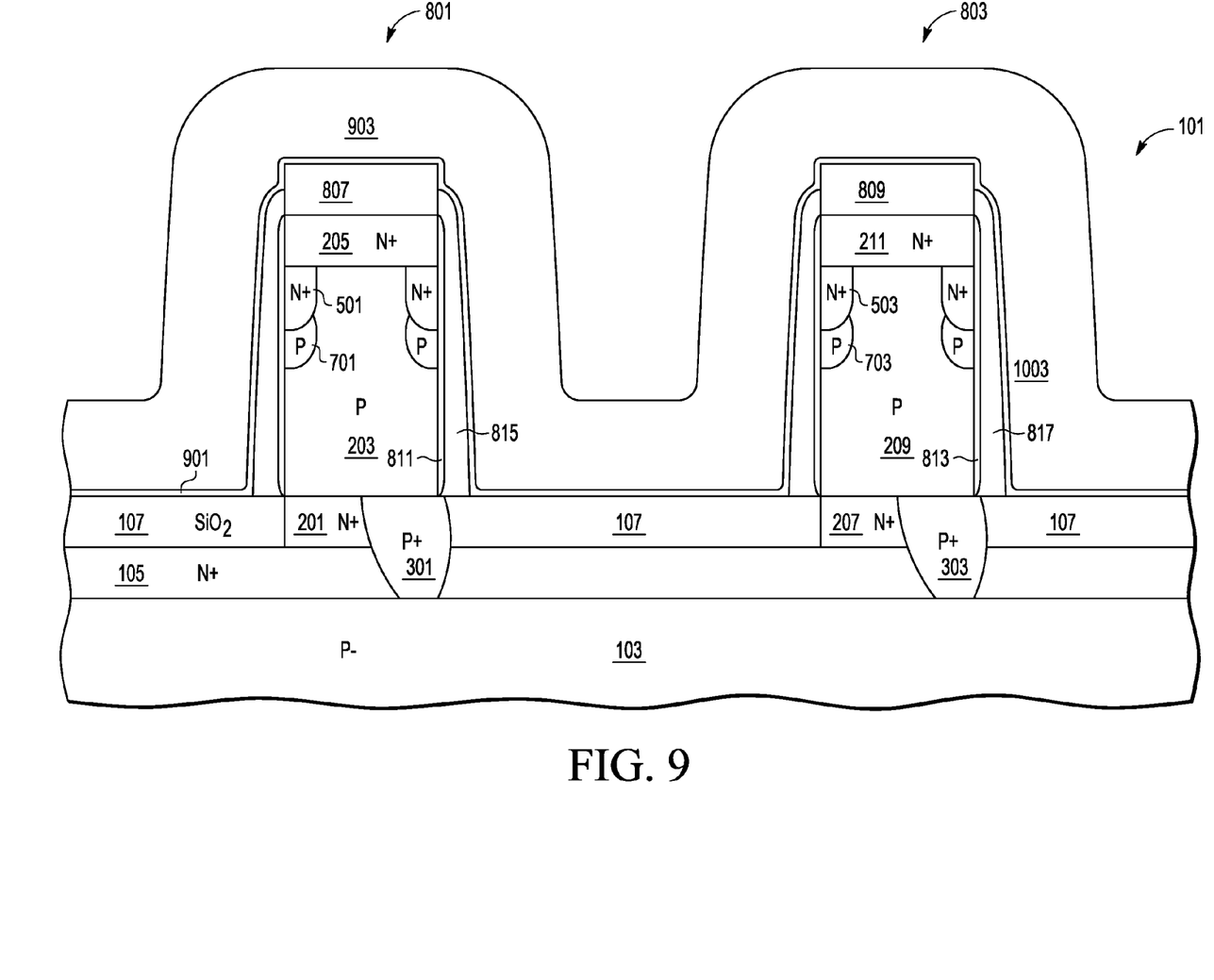

FIG. 9 is a side view of a partial cross section of wafer 101 after a top dielectric layer 901 and gate layer 903 are formed. In one embodiment, dielectric layer 901 is of a dielectric material (e.g. silicon oxide, a high K dielectric material) and has a thickness in the range of 40-100 Angstroms, but may be of other thicknesses in other embodiments. Layer 903 is made of a control gate material (e.g. polysilicon, metal). Layer 903 has a thickness of 300-600 Angstroms, and may be of other thicknesses in other embodiments.

Figure 10:
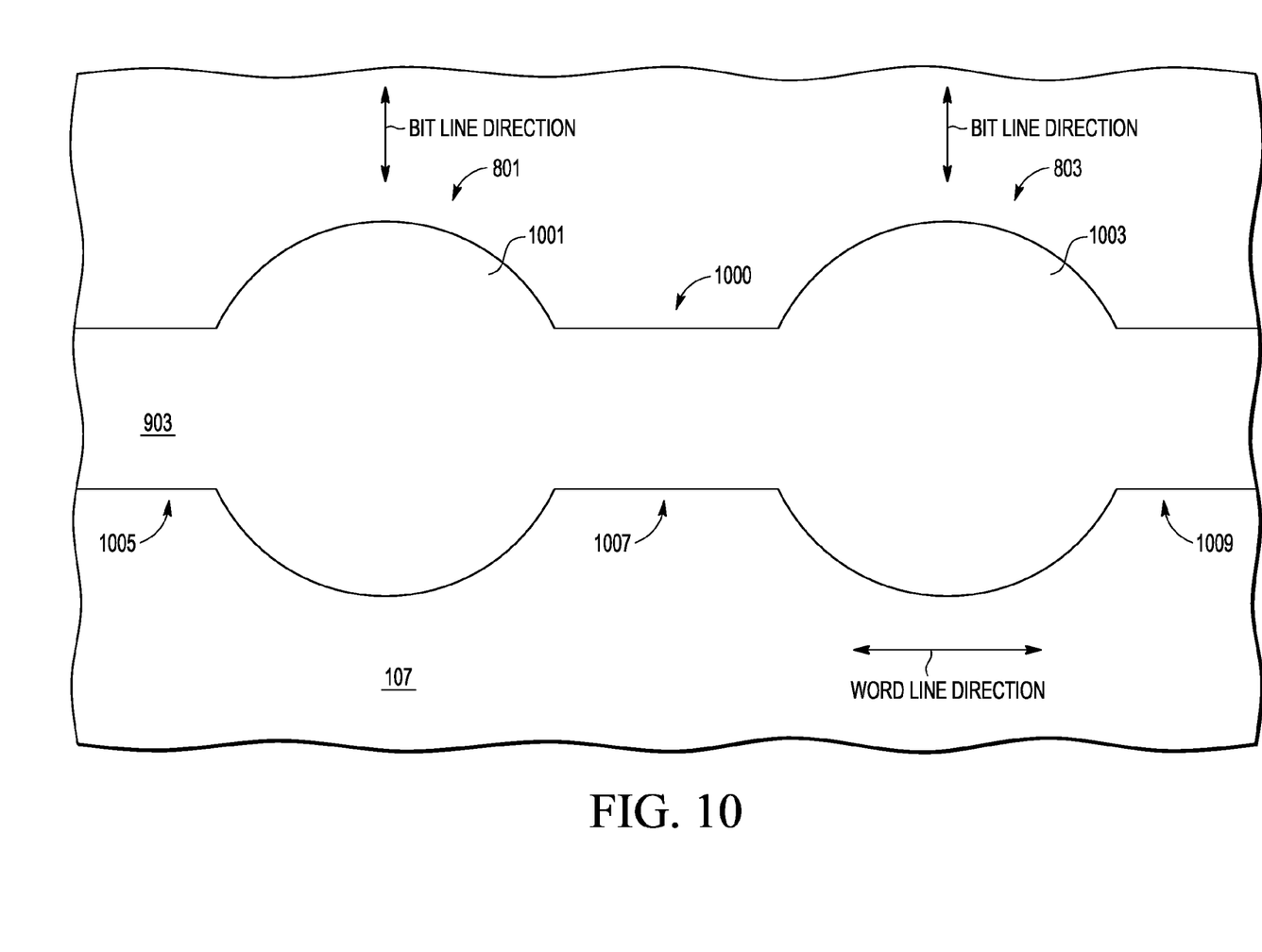

FIG. 10 is a top view of a partial cross section of wafer 101 after layer 903 has been patterned to form the gate/word line structure 1000. After the patterning, portion 1001 of layer 903 covers and surrounds pillar structure 801 and portion 1003 covers and surrounds pillar structure 803. Also a remaining portion of layer 903 includes portions 1005, 1007 and 1009 which form a word line that connects the portions covering the pillar structures to a word line driver circuit (not shown). Also, during this time, wafer 101 may be annealed to activate the implanted dopants. In one embodiment, annealing is performed by a rapid thermal anneal (e.g. heating wafer to 1040 C for 20 seconds) or by a spike anneal.

Figure 11:
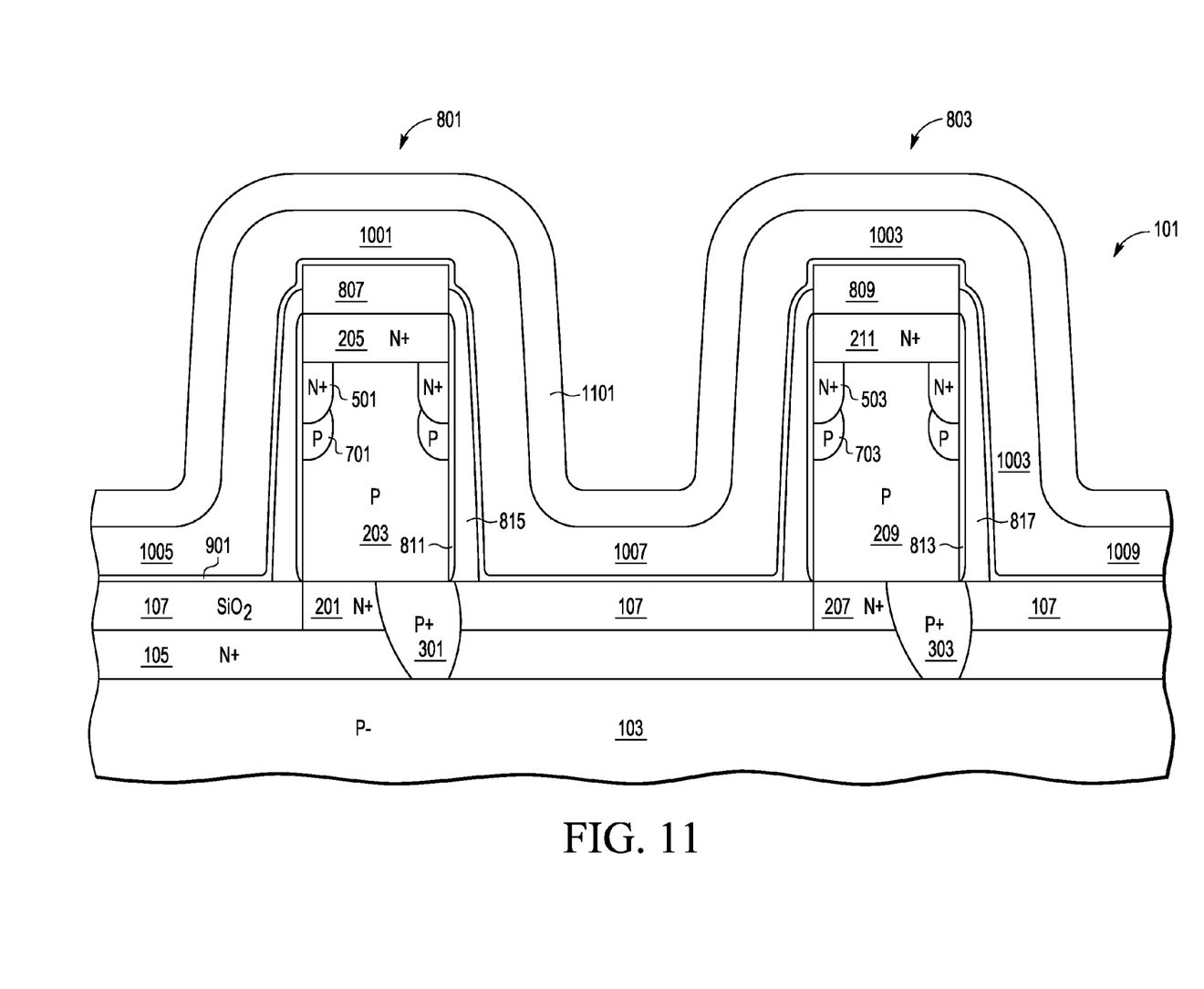

FIG. 11 is a side view of a partial cross section of wafer 101 after a silicide layer 1101 is formed on a polysilicon gate/word line structure 1000. In one embodiment, silicide layer 1101 is formed by forming a metal layer (e.g. cobalt, nickel) over wafer 101. Wafer 101 is then heated to react the metal with exposed silicon to form silicide, and the unreacted metal is removed. However, silicide layer 1101 may be formed by other methods in other embodiments.

Figure 12:
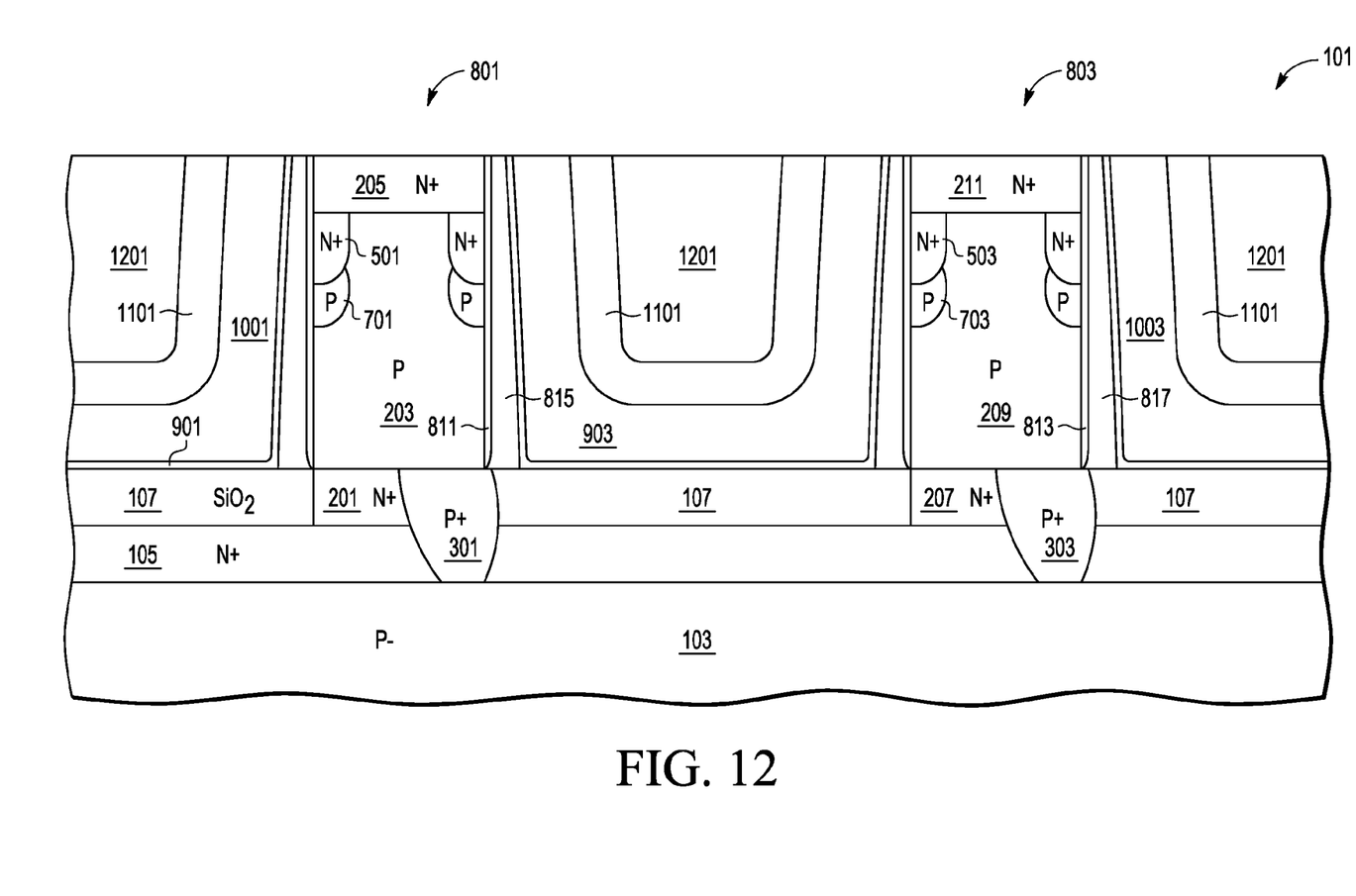

FIG. 12 is a side view of a partial cross section of wafer 101 after a layer 1201 of dielectric material (e.g. oxide) is formed over wafer 101 and then wafer 101 is planarized to the level shown in FIG. 12 to remove caps 807 and 809. In one embodiment, planarization is performed using a timed process. In other embodiments, planarization can be stopped based on a measurement of film thickness.

Forming layer 903 over each pillar and then planarizing the wafer may prevent silicide layer 1101 from residing over charge storage structures 815 and 817.

Figure 13:
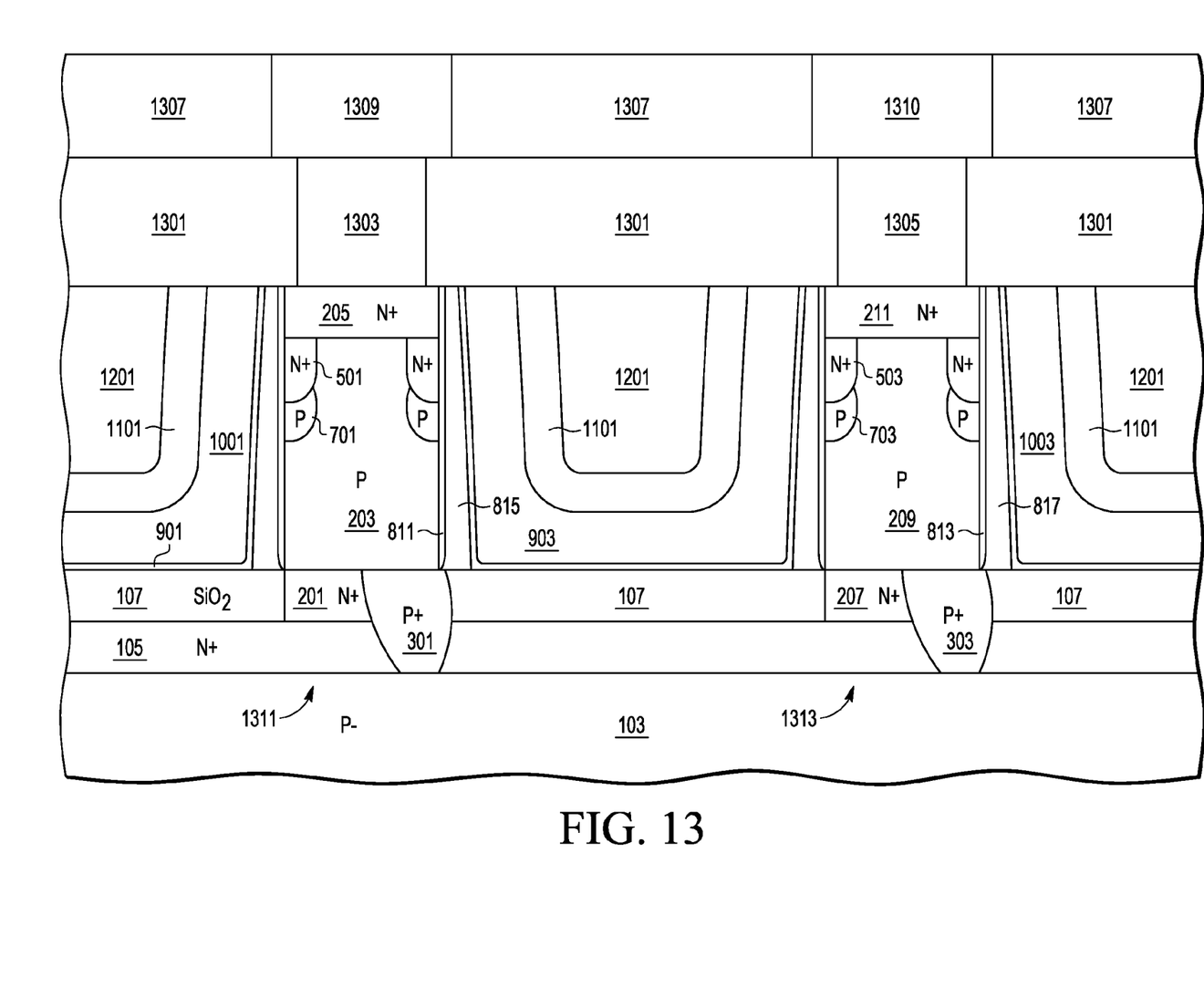

FIG. 13 is a side view of a partial cross section of wafer 101 after conductive plugs 1303 and 1305 and conductive interconnects 1309 and 1310 are formed. In one embodiment, plugs are formed of a plug material such as e.g. tungsten and may include barrier or adhesion layers. Plugs 1303 and 1305 electrically contact regions 205 and 211, respectively. In one embodiment, a layer 1301 of dielectric material is formed over wafer 101 and holes are formed to expose drain regions 205 and 211. In one embodiment, the width of the plugs is smaller than the width of the pillars by at least the alignment tolerance of the stepper used to define the openings for the plugs.

Interconnects 1309 and 1310 are formed of an interconnect material such as copper or aluminum. The interconnects are located in interlayer dielectric layer 1307. In the embodiment shown, interconnects 1309 and 1310 are bit lines that run into and out of the page (relative to the view shown in FIG. 13). Interconnects 1309 and 1310 are electrically connected to other drain regions of other transistors.

As shown, pillar structure 801 forms part of a non volatile memory cell 1311 that includes charge storage structure 815 and a control gate formed from the remaining portion of portion 1001. Memory cell 1311 includes source region 201 coupled to layer 105, which serves as a ground plane that is coupled to all non volatile memory cells of an array, including memory cell 1313. Also, memory cell 1311 includes a body tie region 301, drain region 205, extension region 501, and halo region 701. In a similar manner, pillar structure 803 also forms part of non volatile memory cell 1313. Source and drain regions are current terminal regions for a FET. A gate is a control terminal for a FET.

Cells 1311 and 1313 are located in the same row due to the control gates being coupled to the same word line. Cells 1311 and 1313 are located in different columns in that they are attached to different bit lines.

Subsequent to the view of FIG. 13, other processes may be performed on wafer 101 including the formation of additional interconnect layers and external conductors (e.g. bond pads). Wafer 101 is then singulated to form a number of integrated circuits, each including an array of multiple memory cells similar to memory cells 1311 and 1313.

In other embodiments, the control gate and charge storage structures may only partially surround each pillar. Also, the control gate may have a different thickness e.g. equal to the height of the pillar.

Also in other embodiments, an angled implant may be used to form a source extension annular region for source region 201 and/or halo implant by implanting ions at the appropriate dosage, angle, and energy. Also in other embodiments, the source region may be located on top of the body region with the drain located below the body region.

In the embodiment shown, memory cells 1311 and 1313 include vertical NMOS transistors. However, similar processes may be used to form PMOS transistors where the N type dopants and the P type dopants are switched.

In other embodiments, the processes shown and described herein may be used to form other types of semiconductor devices including diodes, resistors, and other types of transistors including other types of vertical FETs. In some embodiments, the transistors would not include charge storage structures (e.g. 815 and 817). For example, similar processes could be used to form CMOS circuitry. Also, the transistors formed may be used in other types of circuits such DRAM cells, SRAM cells, analog circuitry, and digital circuitry.

Also, other materials may be used as an implant mask in other embodiments such as e.g. oxides, oxynitrides, metals, and organic materials.

Forming an opening in a mask and then using the mask to define annular regions formed by angled ion implantation may advantageously allow for a more precise control of the implanted region. With previous angled ion implant methods where a second lithographically defined mask is used for ion implantation, manufacturing tolerances between the patterning to form a first structure and the patterning to form the implant mask may lead to horizontal displacement of the implanted region. Accordingly, with some embodiments, the mask layer used to define the opening for forming the semiconductor pillar is also used as an implant mask. Thus, horizontal mismatches may advantageously be avoided.

In one embodiment, a method includes forming a mask layer over a substrate and forming an opening. The forming the opening includes forming an opening in the mask layer. The method includes forming a semiconductor layer in the opening to a distance below a top surface of the mask layer. The method also includes performing an angled ion implantation in the semiconductor layer within the opening wherein the angled ion implantation is performed while the substrate is rotated a predetermined amount. During the performing, the mask layer inhibits ions from implanting into specific regions of the semiconductor layer.

In another embodiment, a method includes forming a mask layer over a substrate and forming an opening. The forming the opening includes patterning the mask layer to form an opening in the mask layer. The method includes epitaxial growing a semiconductor pillar in the opening. A top surface of the semiconductor pillar is a predetermined distance below a top surface of the mask layer. The method includes performing an angled ion implantation in the semiconductor pillar to form an annular doped region in a portion of the semiconductor pillar.

In another embodiment, a semiconductor device includes a substrate and a semiconductor pillar formed over the substrate. The semiconductor pillar includes a first current terminal region, a second current terminal region, and a body region formed between the first current terminal region and the second current terminal region. The semiconductor pillar includes an annular doped region around at least a portion of a perimeter of the semiconductor pillar. The semiconductor device includes a control terminal formed to surround at least a portion of the perimeter of the semiconductor pillar.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method comprising:
   forming a mask layer over a substrate;
   forming an opening, wherein the forming the opening includes forming an opening in the mask layer;
   forming a semiconductor layer in the opening to a distance below a top surface of the mask layer; and
   performing an angled ion implantation in the semiconductor layer within the opening wherein the angled ion implantation is performed while the substrate is rotated a predetermined amount, wherein during the performing, the mask layer inhibits ions from implanting into specific regions of the semiconductor layer;
   removing the mask layer after performing an angled ion implantation.

2. The method of claim 1, wherein performing the angled ion implantation further comprises rotating the substrate by an amount in a range of between 0-270 degrees around an axis orthogonal to a major surface of the substrate.

3. The method of claim 1, wherein the semiconductor layer comprises a first current terminal region and a second current terminal region, wherein performing the angled ion implantation further comprises performing the ion implantation to form a current terminal extension region in the semiconductor layer.

4. The method of claim 1, wherein forming the semiconductor layer further comprises epitaxially growing silicon in the opening to form a pillar, and wherein performing the angled ion implantation further comprises forming an annular shaped doped region in a portion of the pillar.

5. The method of claim 4, comprising doping the pillar to form a source region, a drain region, and a body region.

6. The method of claim 1, further comprising:
   forming a layer of control terminal material over the substrate after removing the mask layer;
   forming a control terminal structure, wherein the control terminal structure includes a patterned portion of the layer of control terminal material.

7. A method comprising:
   forming a mask layer over a substrate;
   forming an opening, wherein the forming the opening includes forming an opening in the mask layer;
   forming a semiconductor layer in the opening to a distance below a top surface of the mask layer; and
   performing an angled ion implantation in the semiconductor layer within the opening wherein the angled ion implantation is performed while the substrate is rotated a predetermined amount, wherein during the performing, the mask layer inhibits ions from implanting into specific regions of the semiconductor layer;

wherein the semiconductor layer comprises a source region, a body region, and a drain region, wherein performing the angled ion implantation further comprises performing the ion implantation to form a conductive body tie between the body region and the substrate.

8. The method of claim 7, further comprising:
removing the mask layer after performing an angled ion implantation.

9. The method of claim 7, further comprising:
forming a layer of control terminal material over the substrate after performing the angled ion implantation;
forming a control terminal structure, wherein the control terminal structure includes a patterned portion of the layer of control terminal material.

10. A method comprising:
forming a mask layer over a substrate;
forming an opening, wherein the forming the opening includes forming an opening in the mask layer;
forming a semiconductor layer in the opening to a distance below a to surface of the mask layer; and
performing an angled ion implantation in the semiconductor layer within the opening wherein the angled ion implantation is performed while the substrate is rotated a predetermined amount, wherein during the performing, the mask layer inhibits ions from implanting into specific regions of the semiconductor layer;
removing the mask layer;
forming a dielectric on a side of the semiconductor layer; and
forming a charge storage structure on the dielectric.

11. The method of claim 10, further comprising:
forming an insulating layer on the charge storage structure; and
forming a layer of control terminal material over the insulating layer.

12. A method comprising:
forming a mask layer over a substrate;
forming an opening, wherein the forming the opening includes patterning the mask layer to form an opening in the mask layer;
epitaxial growing a semiconductor pillar in the opening, a top surface of the semiconductor pillar being a predetermined distance below a top surface of the mask layer; and
performing an angled ion implantation in the semiconductor pillar to form an annular doped region in a portion of the semiconductor pillar, wherein during the performing, the mask layer inhibit ions from implanting into specific regions of the semiconductor pillar;
removing the mask layer after the performing.

13. The method of claim 12, wherein performing the angled ion implantation further comprises rotating the substrate around an axis orthogonal to a major surface of the substrate.

14. The method of claim 12, further comprising:
forming a layer of control terminal material over the substrate after removing the mask layer;
forming a control terminal structure, wherein the control terminal structure includes a patterned portion of the layer of control terminal material.

15. A method comprising:
forming a mask layer over a substrate;
forming an opening, wherein the forming the opening includes patterning the mask layer to form an opening in the mask layer;
epitaxial growing a semiconductor pillar in the opening, a top surface of the semiconductor pillar being a predetermined distance below a top surface of the mask layer; and
performing an angled ion implantation in the semiconductor pillar to form an annular doped region in a portion of the semiconductor pillar;
wherein the semiconductor pillar is doped to form a first current terminal region, a second current terminal region, and a body region;
wherein performing the angled ion implantation further comprises performing the ion implantation to form a conductive body tie between the body region and the substrate.

16. The method of claim 15 wherein during the performing, the mask layer inhibit ions from implanting into specific regions of the semiconductor pillar, the method comprising:
removing the mask layer after the performing.

17. The method of claim 15, further comprising:
forming a layer of control terminal material over the substrate after performing the angled ion implantation;
forming a control terminal structure, wherein the control terminal structure includes a patterned portion of the layer of control terminal material.

18. A method comprising:
forming a mask layer over a substrate;
forming an opening, wherein the forming the opening includes patterning the mask layer to form an opening in the mask layer;
epitaxial growing a semiconductor pillar in the opening, a top surface of the semiconductor pillar being a predetermined distance below a top surface of the mask layer; and
performing an angled ion implantation in the semiconductor pillar to form an annular doped region in a portion of the semiconductor pillar;
removing the mask layer;
forming a dielectric on a side of the semiconductor pillar; and
forming a charge storage structure on the dielectric.

19. The method of claim 18, further comprising:
forming an insulating layer on the charge storage structure; and
forming a layer of control terminal material over the insulating layer.

20. The method of claim 18, further comprising:
forming a layer of control terminal material over the substrate after removing the mask layer;
forming a control terminal structure, wherein the control terminal structure includes a patterned portion of the layer of control terminal material.

* * * * *

UNITED STATES PATENT AND TRADEMARK OFFICE
CERTIFICATE OF CORRECTION

| | | |
|---|---|---|
| PATENT NO. | : 8,304,331 B2 | Page 1 of 1 |
| APPLICATION NO. | : 12/787101 | |
| DATED | : November 6, 2012 | |
| INVENTOR(S) | : Mark D. Hall | |

It is certified that error appears in the above-identified patent and that said Letters Patent is hereby corrected as shown below:

In the Claims:

At column 9, line 24, please change "below a to surface" to be --below a top surface--

Signed and Sealed this
Fourteenth Day of May, 2013

Teresa Stanek Rea
*Acting Director of the United States Patent and Trademark Office*